United States Patent
Yoo

(10) Patent No.: US 10,847,721 B2
(45) Date of Patent: Nov. 24, 2020

(54) NONVOLATILE MEMORY DEVICE

(71) Applicant: SK hynix Inc., Icheon-si (KR)

(72) Inventor: Hyangkeun Yoo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 64 days.

(21) Appl. No.: 16/171,884

(22) Filed: Oct. 26, 2018

(65) Prior Publication Data
US 2019/0288202 A1    Sep. 19, 2019

(30) Foreign Application Priority Data
Mar. 15, 2018    (KR) .................. 10-2018-0030343

(51) Int. Cl.
*H01L 45/00* (2006.01)
(52) U.S. Cl.
CPC ............ *H01L 45/146* (2013.01); *H01L 45/04* (2013.01); *H01L 45/12* (2013.01); *H01L 45/1233* (2013.01); *H01L 45/1253* (2013.01)

(58) Field of Classification Search
CPC ........................................ H01L 45/02
See application file for complete search history.

(56) References Cited

U.S. PATENT DOCUMENTS

| | | |
|---|---|---|
| 2010/0283028 A1 | 11/2010 | Brubaker et al. |
| 2013/0221307 A1* | 8/2013 | Wang ............... H01L 45/16 257/2 |
| 2014/0175356 A1* | 6/2014 | Wang ............... H01L 45/10 257/2 |
| 2015/0255714 A1 | 9/2015 | Cario et al. |

* cited by examiner

*Primary Examiner* — Cheung Lee

(57) ABSTRACT

A nonvolatile memory device according to an embodiment includes a first electrode layer, a first barrier layer, a resistive memory layer, a second barrier layer and a second electrode layer that are sequentially disposed. The resistive memory layer comprises a Mott material, the Mott material having a resistivity that varies depending on an externally applied electric field.

20 Claims, 8 Drawing Sheets

NONVOLATILE MEMORY DEVICE

CROSS-REFERENCE TO RELATED APPLICATION

The present application claims priority under 35 U.S.C. 119(a) to Korean Patent Application No. 10-2018-0030343, filed on Mar. 15, 2018, which is herein incorporated by reference in its entirety.

BACKGROUND

1. Technical Field

Various embodiments of the present disclosure generally relate to a semiconductor device, and more particularly, relate to a nonvolatile memory device.

2. Related Art

Recently, studies on strongly correlated electron system materials have been getting attention. Generally, interactions due to Coulomb repulsive force can occur between electrons in a solid. Such materials having a strong interaction among its electrons are referred to as strongly correlated electron system materials. Studies on the electrical properties of the strongly correlated electron system materials have recently become an important topic of study in the physics of cohesive materials. For example, there are studies on high temperature superconductors, Fermion materials, organic conductors and low dimensional electromagnetic fields in relation to the applications for strongly correlated electron system materials.

Meanwhile, at least some of the strongly correlated electron system materials may be characterized as Mott materials, which exhibit a Mott metal-insulator transition phenomenon. The Mott metal-insulator transition phenomenon means a phenomenon in which electrons in the strongly correlated electron system material are switched between a quantum localization state and a quantum delocalization state by external excitation. At this time, when the electrons have a localization state, the strongly correlated electron system material as a whole may have an insulative state in which the electrons cannot move or migrate. On the other hand, when the electrons have a delocalization state, the strongly correlated electron system material as a whole may have a conductive state in which the electrons can move or migrate. The external excitation may include, for example, thermal excitation, electrical excitation, optical excitation, mechanical excitation and the like. The above-mentioned Mott metal-insulator transition phenomenon is referred to as a quantum phase transition because it occurs by qualitatively changing the quantum mechanical structure in the material.

SUMMARY

There is disclosed a nonvolatile memory device according to one aspect of the present disclosure. The nonvolatile memory device includes a first electrode layer, a first barrier layer, a resistive memory layer, a second barrier layer and a second electrode layer that are sequentially disposed. The resistive memory layer comprises a Mott material, the Mott material having resistivity that varies depending on an externally applied electric field.

There is disclosed a nonvolatile memory device according to another aspect of the present disclosure. The nonvolatile memory device includes a first electrode layer, a first barrier layer, a resistive memory layer including a Mott material, a second barrier layer and a second electrode layer that are sequentially disposed. The first and second electrode layer have different work functions, and the Mott material has one of a pair of different resistivities.

DETAILED DESCRIPTION

Figure 1:
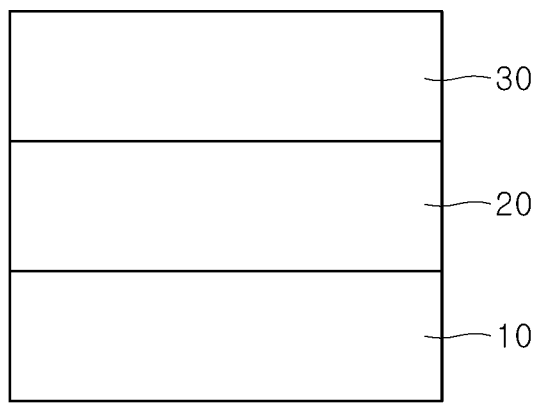
FIG. 1 is a cross-sectional view schematically illustrating a Mott selection element according to a comparative example of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

A threshold switch described herein means a device having a threshold switching layer that performs a threshold switching operation. The threshold switching operation means an operation in which, when an external voltage is applied to the threshold switching layer, the density of a current passing through the threshold switching layer is increased to a value equal to or greater than a predetermined reference value when the applied external voltage is equal to or higher than a threshold voltage. When the threshold switching layer is electrically turned on, and the density of the current passing through the threshold switching layer is decreased to a value less than the reference value when the applied voltage is lower than the predetermined threshold voltage, then the threshold switching layer is electrically turned off. That is, the threshold switching operation may be a volatile non-memory switching operation. In an embodiment, the threshold switching layer can be applied to or used in a selection element of a nonvolatile memory device having a cross-point cell array structure.

A resistive memory layer described herein may mean a thin film whose internal resistance is variably changed between a plurality of resistance states when a predetermined voltage or current is applied from outside or an external source. In addition, the resistive memory layer may store the changes in internal resistance in a nonvolatile manner.

In this specification, a Mott material means a material implementing or subject to Mott metal-insulator transition. The Mott metal-insulator transition means a phenomenon in which resistance of the material is switched between an insulative state and a conductive state by or in response to external excitation. The external excitation may include thermal excitation, electrical excitation, optical excitation, mechanical excitation and the like. The Mott material can be differentiated from a resistive change material in that the Mott material does not involve or depend on the formation of filaments by defects or movement of conductive particles during the Mott metal-insulator transition process. Also, the Mott material can be differentiated from a phase change material in that no phase transformation between an amorphous phase and a crystalline phase occurs in the metal-insulator transition process.

Figure 2:
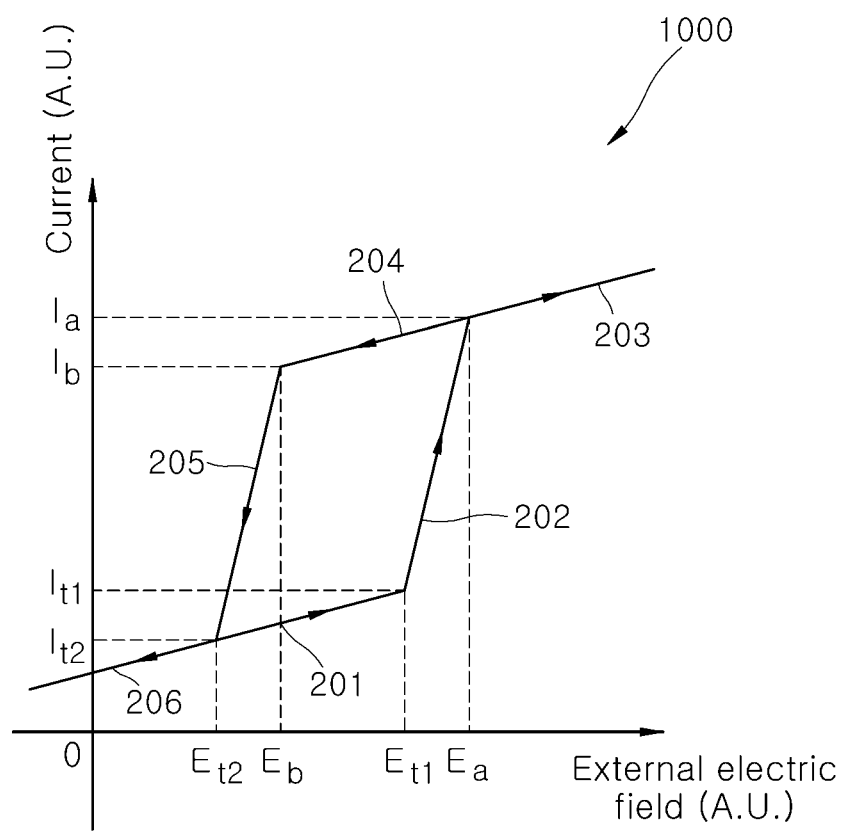
FIG. 2 is a graph illustrating electrical characteristics of the Mott selection element of FIG. 1.

FIG. 1 is a cross-sectional view schematically illustrating a Mott selection element according to a comparative example of the present disclosure. FIG. 2 is a graph illustrating electrical characteristics of the Mott selection element of FIG. 1. The Mott selection element can perform a threshold switching operation using the Mott metal-insulator transition of a Mott material. In an embodiment, the Mott selection element can be employed as a threshold switch for suppressing a sneak current between neighboring memory cells in a resistive memory device having a cross-point array cell structure. Specifically, in some cross-point cell array structures, the Mott selection element can be disposed or arranged to be connected in series to a resistive memory device within the memory cell.

Referring to FIG. 1, the Mott selection element 1 may include a first electrode layer 10, a switching layer 20 and a second electrode layer 30. The first and second electrode layers 10 and 30 may include a conductive material. The conductive material may include, for example, tungsten (W), titanium nitride (TiN) and the like. The switching layer 20 may include a Mott material. The Mott material may include, for example, a transition metal oxide having 3d, 4d, or 4f orbitals that are partially filled with electrons. The Mott material may include, for example, vanadium oxide ($VO_2$ or $V_2O_3$), chromium oxide ($CrO_2$), nickel oxide (NiO), copper oxide (CuO), niobium oxide ($NbO_2$) and the like.

FIG. 2 illustrates an output current varying depending on an external electric field when the external electric field is applied to the Mott selection element 1 of FIG. 1. In an embodiment, graph 1000 indicates an output current measured from the Mott selection element when an external electric field having a positive polarity is applied to the second electrode layer 30 while the first electrode layer 10 is grounded. The first electrode layer 10 and the second electrode layer 30 may be formed of the same conductive material. As an example, the first and second electrode layers 10 and 30 may be titanium oxide layers.

Referring to the graph 1000 of FIG. 2, as the magnitude of the external electric field increases, the output current may gradually increase along a first part 201 of the graph 1000 before the external electric field reaches a first threshold electric field $E_{t1}$. When the external electric field reaches the first threshold electric field $E_{t1}$, the output current may more rapidly increase along a second part 202 of the graph 1000. That is, when the external electric field reaches the first threshold electric field $E_{t1}$, switching from an insulative state to a conductive state in the switching layer 20 begins. When the external electric field reaches a first target electric field $E_a$, the switching layer 20 can complete its transition to a conductive state. If the external electric field is increased to the first target electric field $E_a$ and higher, then the output current may gradually increase along a third part 203 of the graph 1000.

From a conductive state, the applied external electric field may be decreased to the first target electric field $E_a$ or lower. At this time, the output current measured from the Mott selection element 1 may gradually decrease along a fourth part 204 of the graph 1000. When the external electric field reaches a second target electric field $E_b$, the output current may more rapidly decrease along a fifth part 205 of the graph 1000. That is, when the external electric field reaches the second target electric field $E_b$ and continues to decrease, switching from the conductive state to the insulative state begins in the switching layer 20. When the external electric field reaches a second threshold electric field $E_{t2}$, switching to the insulative state in the switching layer 20 may be completed. If the external electric field is decreased to the second threshold electric field $E_{t2}$ or lower, then the output current may be gradually decreased along a sixth part 206 of the graph 1000.

As described above, the Mott selection element 1 may exhibit a hysteresis operation for switching back and forth between an insulative state and a conductive state depending on an applied external electric field. However, when the external electric field is removed, the Mott selection element 1 can recovers the insulative state. That is, the Mott selection element 1 can perform the threshold switching operation to a conductive state only when the external electric field is increased to the first threshold electric field $E_{t1}$ or higher. Meanwhile, in the graph 1000, first and second target currents $I_a$ and $I_b$, and first and second threshold currents $I_{t1}$ and $I_{t2}$ may mean output currents measured from the Mott selection element 1 when the external electric field is at the first and second target electric fields $E_a$ and $E_b$, and the first and second threshold electric fields $E_{t1}$ and $E_{t2}$, respectively.

As described above, the Mott selection element 1 according to the comparative example can function as a volatile switching element performing a threshold switching operation. In contrast, in the nonvolatile memory device according to an embodiment described below, the threshold switching operation of a Mott selection element can be converted into a nonvolatile memory operation. That is, the insulative state and the conductive state, which are distinguished from each other, can be selectively implemented and retained even when the external electric field is removed. In order to implement the nonvolatile memory operation described above, the following describes a method of forming an internal electric field in a switching layer including a Mott material.

Figure 3:
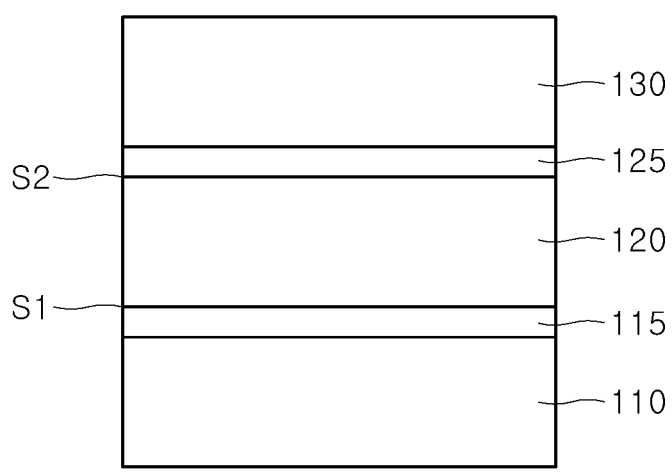
FIG. 3 is a cross-sectional view schematically illustrating a nonvolatile memory device according to an embodiment of the present disclosure.
Figure 4A:
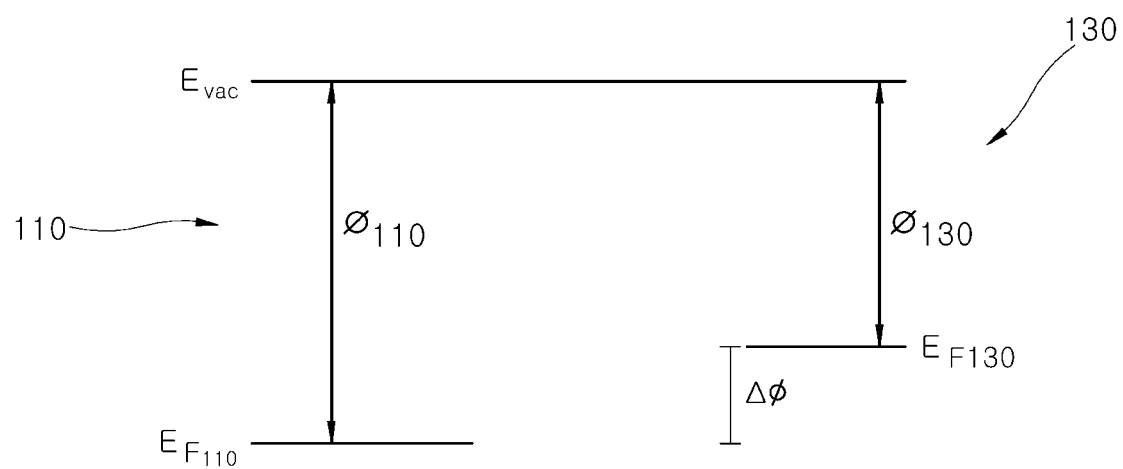
FIGS. 4A and 4B are views illustrating energy states in a nonvolatile memory device according to an embodiment of the present disclosure.
Figure 4B:
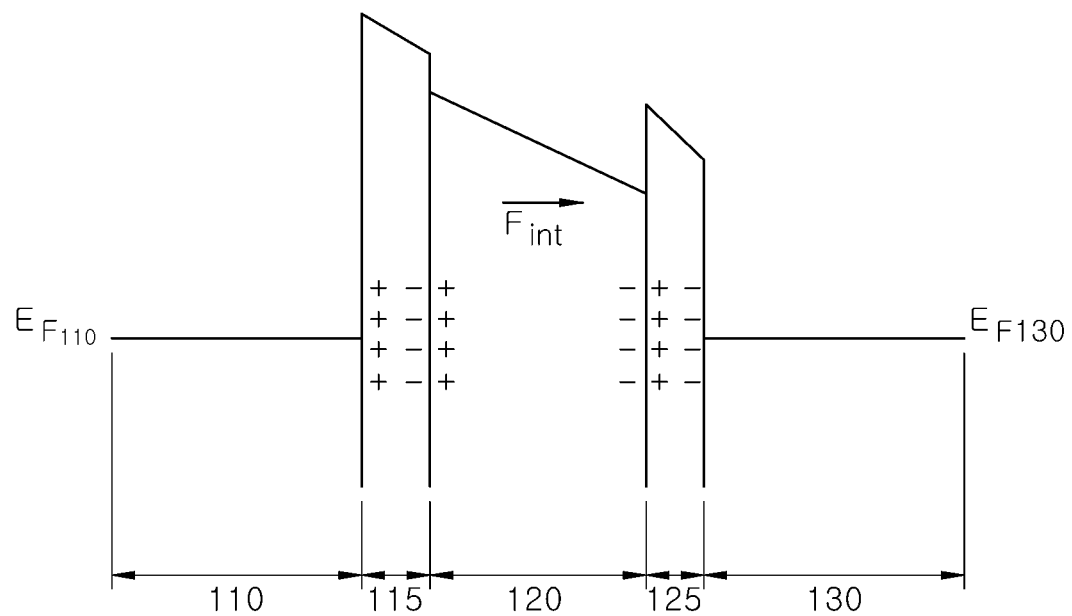
Figure 5:
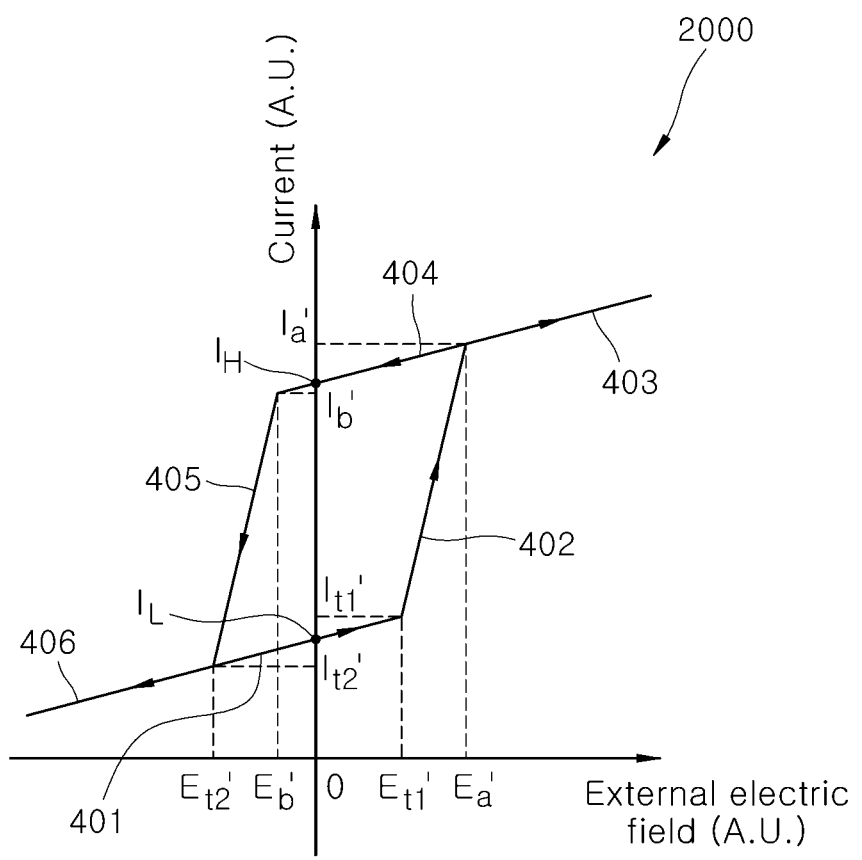
FIG. 5 is a graph illustrating electrical characteristics of a nonvolatile memory device according to an embodiment of the present disclosure.

FIG. 3 is a cross-sectional view schematically illustrating a nonvolatile memory device according to an embodiment of the present disclosure. FIGS. 4A and 4B are views illustrating energy states in the nonvolatile memory device according to an embodiment of the present disclosure. FIG. 5 is a graph illustrating electrical characteristics of the nonvolatile memory device according to an embodiment of the present disclosure.

Referring to FIG. 3, the nonvolatile memory device 2 may include, sequentially stacked, a first electrode layer 110, a first barrier layer 115, a resistive memory layer 120 including a Mott material, a second barrier layer 125 and a second electrode layer 130. The resistive memory layer 120 may have a resistance state that can be variably switched between an insulative state and a conductive state. In addition, the resistive memory layer 120 may store either resistance state in a nonvolatile manner.

The first and second electrode layers 110 and 130 may be configured to have different work functions from each other. An internal electric field may be formed in the resistive memory layer 120 due to the difference between the work functions of the first and second electrode layers 110 and 130. In an embodiment, an internal electric field having a size of one megavolt per centimeter (1 MV/cm) or greater can be formed in the resistive memory layer 120 by controlling the space or distance between the first and second electrode layers 110 and 130, as well as by controlling the work function difference between the first and second electrode layers 110 and 130. At this time, the spacing between the first and second electrode layers 110 and 130 may be controlled by selecting the thicknesses of the first and second barrier layers 115 and 125 and/or the thickness of the resistive memory layer 120. As an example, when the work function difference between the first and second electrode layers 110 and 130 is one electron volt (1 eV) and the spacing between the first and second electrode layers 110 and 130 is one nanometer (1 nm), an electric field of about one megavolt per centimeter (1 MV/cm) can be formed between the first and second electrode layers 110 and 130. As another example, when the work function difference between the first and second electrode layers 110 and 130 is a half electron volt (0.5 eV) and the spacing between the first and second electrode layers 110 and 130 is a half nanometer (0.5 nm), an electric field of about one megavolt per centimeter (1 MV/cm) can be formed between the first and second electrode layers 110 and 130.

In an embodiment, one of the first and second electrode layers 110 and 130 may include ruthenium (Ru), and the other may include tungsten (W) or titanium nitride (TiN). An electrode layer having ruthenium (Ru) has a greater work function than an electrode layer including tungsten (W) or titanium nitride (TiN). In another embodiment, one of the first and second electrode layers 110 and 130 may include silicon (Si) having an n-type dopant of relatively low concentration and the other electrode layer may include silicon (Si) having an n-type dopant of relatively high concentration. The electrode layer with silicon (Si) having an n-type dopant of relatively low concentration may have a work function greater than that of the electrode layer with silicon (Si) having an n-type dopant of relatively high concentration.

The resistive memory layer 120 may include a Mott material. The Mott material may have resistivity varying depending on an external electric field and may store the varied resistivity in a nonvolatile manner. In an embodiment, the Mott material may have a pair of resistances different from each other depending on the external electric field. The Mott material may have either one of the pair of resistances in a state where the external electric field is removed.

The Mott material may include, for example, transition metal oxide having 3d, 4d or 4f orbitals partially filled with electrons. The Mott material may include, for example, vanadium oxide ($VO_2$ or $V_2O_3$), chromium oxide ($CrO_2$), nickel oxide (NiO), copper oxide (CuO), niobium oxide ($NbO_2$) and the like.

In an embodiment, the Mott material may include a stoichiometric metal-oxygen bond in an insulative state. In addition, the stoichiometric Mott material may be changed or modified to include oxygen vacancies or metal vacancies in a conductive state, thereby having non-stoichiometric metal-oxygen bonds. Meanwhile, the resistive memory layer 120 may have a thickness of one to ten nanometers (1 to 10 nm).

The first barrier layer 115 may be disposed between the first electrode layer 110 and the resistive memory layer 120. The second barrier layer 125 may be disposed between the resistive memory layer 120 and the second electrode layer 130. The first and second barrier layers 115 and 125 may form a first interface S1 and a second interface S2 with the resistive memory layer 120, respectively. The first and second barrier layers 115 and 125 may function to control the internal electric field so that it is maintained in the resistive memory layer 120 even after the resistance state of the resistive memory layer 120 is switched from an insulative state to a conductive state or vice versa. The first and second barrier layers 115 and 125 may include silicon oxide, silicon nitride, aluminum oxide, silicon oxynitride or a combination of two or more thereof. In an embodiment, the first and second barrier layers 115 and 125 may be formed of the same material. In another embodiment, the first and second barrier layers 115 and 125 may be formed of different materials. Each of the first and second barrier layers 115 and 125 may have a thickness of a half to two nanometers (0.5 to 2 nm).

FIG. 4A is an energy diagram illustrating the work functions $\Phi_{110}$ and $\Phi_{130}$ of the first and second electrode layers 110 and 130 of FIG. 3. As an example, FIG. 4A illustrates a case in which the work function Olio of the first electrode layer 110 is greater than the work function $\Phi_{130}$ of the second electrode layer 130. In FIG. 4A, $E_{F110}$, $E_{F130}$, $E_{vac}$, and $\Delta\Phi$ may correspond to a Fermi energy level of the first electrode layer 110, a Fermi energy level of the second electrode layer 130, an energy level of vacuum, and a work function difference between the first electrode layer 110 and the second electrode layer 130, respectively.

Referring to FIG. 4B, when the nonvolatile memory device 2 is manufactured using the first and second electrode layers 110 and 130 of FIG. 4A, an internal electric field $F_{int}$ may be formed in the resistive memory layer 120 due to the work function difference between the first and second electrode layers 110 and 130 in the as-manufactured nonvolatile memory device 2. That is, when the first and second electrode layers 110 and 130 of FIG. 4A are bonded to the first barrier layer 115, the resistive memory layer 120 and the second barrier layer 125, electrons may move or migrate from the second electrode layer 110 having a relatively low work function to the first electrode layer 130 having a relatively high work function, as illustrated in an energy band diagram in FIG. 4B. Due to electron movement, positive or negative charges can be generated and accumulated inside the first and second barrier layers 115 and 125 and the resistive memory layer 120. As an example, positive charges may be generated and accumulated in the resistive memory layer 120 at or near contact with the first interface S1 of FIG. 3, and negative charges may be generated and accumulated in the resistive memory layer 120 at or near contact with the second interface S2. The internal electric field $F_{int}$ may form in the resistive memory layer 120 resulting from the polarity that results from the accumulated positive and negative charges. The internal electric field $F_{int}$ may be maintained in the resistive memory layer 120 even when no external electric field is applied to the nonvolatile memory device 2. As a result, as shown in FIG. 5, the internal electric field $F_{int}$ can change a threshold value of the external electric field required for the resistance switching of the Mott material.

FIG. 5 is a hysteresis graph 2000 illustrating an output current that varies depending on an externally applied electric field that is applied to the nonvolatile memory device 2 of FIG. 3. In this embodiment, as described above in connection with FIGS. 3, 4A and 4B, a shape of the hysteresis graph 2000 can be modified to be different from the shape of the hysteresis graph 1000 of FIG. 2 because of the internal electric field $F_{int}$ formed in advance in the resistive memory layer 120, which includes the Mott material. More specifically, first and second threshold electric fields $E_{t1}'$ and $E_{t2}'$ of the hysteresis graph 2000 of FIG. 5 can be shifted in a negative electric field direction relative to the first and second threshold electric fields $E_{t1}$ and $E_{t2}$ of the hysteresis graph 1000 of FIG. 2.

In an embodiment, the resistive memory layer 120 may be controlled to have the first threshold electric field $E_{t1}'$ having a positive polarity and the second threshold electric field $E_{t2}'$ having a negative polarity. Referring to the hysteresis graph 2000 of FIG. 5, in a state in which no external electric field is applied, the resistive memory layer 120 may have high resistivity indicating an insulative state, that is, a high resistance state corresponding to a current value of $I_L$, or may have low resistivity indicating a conductive state, that is, a low resistance state corresponding to a current value of $I_H$. Each of the resistivities of the resistive memory layer 120 in the state in which no external electric field is applied can be caused or created by an internal electric field formed in the resistive memory layer 120 due to a work function difference between the first and second electrode layers 110 and 130. As an example, as illustrated in FIGS. 4A and 4B, the work function Φlio of the first electrode layer 110 may be greater than the work function $\Phi_{110}$ of the second electrode layer 130, and thus, the internal electric field $F_{int}$ can be formed in the resistive memory layer 120.

Meanwhile, referring to FIG. 5, in a state in which the first electrode layer 110 of the nonvolatile memory device 2 is grounded, the output current may be measured while an external electric field having a positive polarity is applied to the second electrode layer 130. In an embodiment, when the resistive memory layer 120 has high resistivity indicating an insulative state, the output current may be gradually increased along a first part 401 of the graph 2000 until the external electric field reaches the first threshold electric field $E_{t1}'$. When the external electric field reaches the first threshold electric field $E_{t1}'$, the output current may be rapidly increased along a second part 402 of the graph 2000. That is, when the external electric field reaches the first threshold electric field $E_{t1}'$, switching from the insulative state to the conductive state begins in the switching layer 120. When the external electric field reaches a first target electric field $E_a'$, the switching to the conductive state is completed in the resistive memory layer 120. If the external electric field is increased to the first target electric field $E_a'$ or higher, then the output current may be gradually increased along a third part 403 of the graph 2000.

When the external electric field is decreased again to the first target electric field $E_a'$ or lower, the output current measured from the nonvolatile memory device 2 gradually decreases along a fourth part 404 of the graph 2000. Next, when the external electric field is removed, the resistive memory layer 120 may have low resistivity indicating the conductive state corresponding to a current value of $I_H$. At this time, the resistive memory layer 120 may be electrically insulated from the first and second electrode layers 110 and 130 by the first and second barrier layers 115 and 125, respectively, thereby effectively storing the conductive state. Consequently, the nonvolatile memory device 2 can store signal information corresponding to the conductive state of the resistive memory layer 120 in a nonvolatile manner.

Next, with respect to the nonvolatile memory element 2 storing the conductive state as signal information, the output current may be measured while an external electric field having a negative polarity is applied to the second electrode layer 130 in a state in which the first electrode layer is grounded. Referring to FIG. 5, as an absolute value of the external electric field is increased in the negative direction, the output current may be gradually decreased from the current value of $I_H$ along the fourth part 404 of the graph 2000. The decrease of the output current, in spite of the increase of the absolute value of the external electric field, may occur in the process of offsetting the internal electric field $F_{int}$ of the resistive memory layer 120 described above. When the external electric field reaches a second target electric field $E_b'$, the output current may more rapidly decrease along a fifth part 405 of the graph 2000. That is, when the external electric field reaches the second target electric field $E_b'$, switching from the conductive state to the insulative state begins in the resistive memory layer 120. When the external electric field reaches the second threshold electric field $E_{t2}'$, the switching to the insulative state may be completed in the resistive memory layer 120. That is, the resistive memory layer 120 can be converted to have the high resistivity corresponding to an insulative state.

The output current may not be increased even when the absolute value of the external electric field is increased to the absolute value of the second threshold electric field $E_{t2}'$ or higher, but instead gradually decreases along a sixth part 406 of the graph 2000. The progressive decrease of the output current along the sixth part 406 may mean that the external electric field is still offsetting the internal electric field $F_{int}$ formed in the resistive memory layer 120 having high resistivity.

Next, the absolute value of the external electric field may decrease again. At this time, the output current measured from the nonvolatile memory device 2 may gradually increase along the first part 401 of the graph 2000. When the external electric field is removed, the resistive memory layer 120 may retain the high resistivity indicating the insulative state corresponding to the current value of $I_L$. As a result, the nonvolatile memory device 2 can store signal information corresponding to the insulative state in a nonvolatile manner.

Meanwhile, in the graph 2000, the first and second target currents $I_a'$ and $I_b'$, and the first and second threshold currents $I_{t1}'$ and $I_{t2}'$ may correspond to the output currents measured from the nonvolatile memory device 2 when the external electric field is the first and second target electric fields $E_a'$ and $E_b'$, and the first and second threshold electric fields $E_{t1}'$ and $E_{t2}'$, respectively.

As described above, according to an embodiment of the present disclosure, a nonvolatile memory device applying a Mott material to a resistive memory layer can be manufactured. As described above, the nonvolatile memory device may exhibit a hysteresis operation of an output current illustrated in FIG. 5. The nonvolatile memory characteristics may result from an internal electric field generated inside the Mott material. The internal electric field may be generated by a difference between the work functions of a pair of electrode layers disposed at both ends, or on opposite sides, of the resistance memory layer. The internal electric field can be maintained in the Mott material even when no separate external electric field is applied. The internal electric field converts the volatile Mott metal-insulator-transition operation of the Mott material into a nonvolatile memory operation, thereby effectively implementing a nonvolatile memory device.

Figure 6:
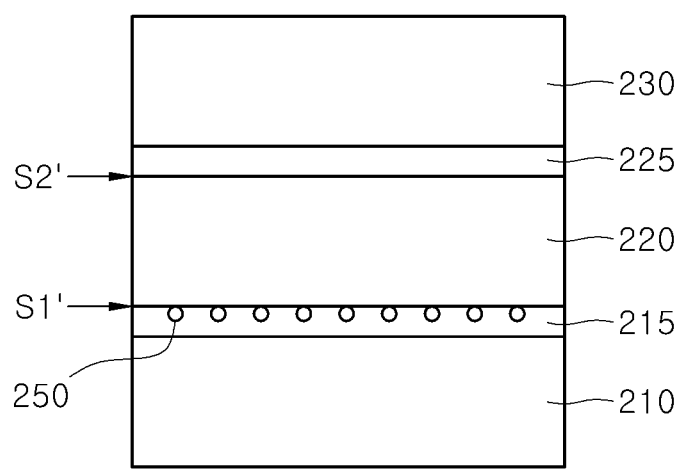
FIG. 6 is a cross-sectional view schematically illustrating a nonvolatile memory device according to another embodiment of the present disclosure.
Figure 7:
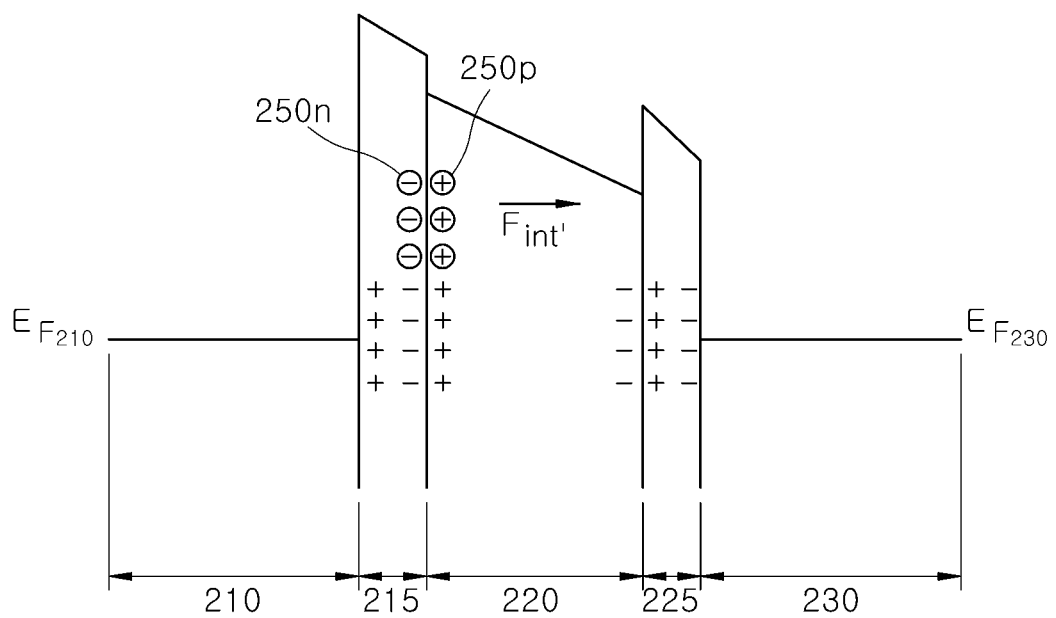
FIG. 7 is a view illustrating energy states in a nonvolatile memory device according to another embodiment of the present disclosure.

FIG. 6 is a cross-sectional view schematically illustrating a nonvolatile memory device according to another embodiment of the present disclosure. FIG. 7 is a view illustrating energy states of the nonvolatile memory device according to another embodiment of the present disclosure.

Referring to FIG. 6, the nonvolatile memory device 3 may include, disposed in sequence, a first electrode layer 210, a first barrier layer 215, a resistive memory layer 220 including a Mott material, a second barrier layer 225 and a second electrode layer 230. The resistive memory layer 220 may have a resistance state that can variably switch between an insulative state and a conductive state. In addition, the resistive memory layer 220 can store either switched resistance state in a nonvolatile manner.

The first and second electrode layers 210 and 230 may be configured to have different work functions. The first and second electrode layers 210 and 230 may be substantially the same as the first and second electrode layers 110 and 130 of the nonvolatile memory device 2 described above and with reference to FIG. 3. Accordingly, in order to exclude duplication, a detailed description of first and second electrode layers 210 and 230 is omitted here. The resistive memory layer 220 may include a Mott material. The Mott material may have a resistance state that varies depending on an externally applied electric field, and the Mott material can function to store a variable resistance state in a nonvolatile manner. The resistive memory layer 220 may be substantially the same as the resistive memory layer 120 of the nonvolatile memory device 2 described above and with reference to FIG. 3. Accordingly, in order to exclude duplication, a detailed description is omitted here.

The first barrier layer 215 may be disposed between the first electrode layer 210 and the resistive memory layer 220. The second barrier layer 225 may be disposed between the resistive memory layer 220 and the second electrode layer 230. The first and second barrier layers 215 and 225 may form a first interface S1' and a second interface S2' with the resistive memory layer 220, respectively.

The first and second barrier layers 215 and 225 can perform a function of controlling an internal electric field maintained in the resistive memory layer 220 after the resistance state is switched from an insulative state to a conductive state. The first and second barrier layers 215 and 225 may include silicon oxide, silicon nitride, aluminum oxide, silicon oxynitride or a combination of two or more thereof. In an embodiment, the first and second barrier layers 215 and 225 may be formed of the same material. In another embodiment, the first and second barrier layers 215 and 225 may be formed of different materials.

In an embodiment, as illustrated in FIG. 6, when the work function of the first electrode layer 210 is relatively high between the first and second electrode layers 210 and 230, the first barrier layer 215 may include trap sites 250 having negative fixed charges disposed in a region of the first barrier layer 215 adjacent to the first interface S1'. As an example, the trap sites 250 may include defects like oxygen vacancies. In an embodiment, the trap sites 250 may be obtained by forming oxygen vacancies in the region of first barrier layer 215. In an embodiment, a method of forming the oxygen vacancies includes a method of controlling the supply of the oxygen source to control amounts of oxygen when the first barrier layer 215 having, for example, oxides or oxynitrides, is formed by a chemical vapor deposition method, an atomic layer deposition method and the like. In another embodiment, a method of forming the oxygen vacancies includes a method of removing oxygen from a surface region of the first barrier layer 215 having, for example, oxides or oxynitrides, by treating the surface region after forming the first barrier layer 215 using a vapor deposition method. In this embodiment, it would not be necessary to control gas supplied from the oxygen source during the formation of the first barrier layer 215.

In another embodiment, which is not illustrated, when the work function of the second electrode layer 230 is relatively high as between the first and second electrode layers 210 and 230, fixed trap sites having negative fixed charges may be disposed in the region of the second barrier layer 225 adjacent to the second interface S2'. As an example, the trap sites may be formed by a method substantially the same as the method of generating the oxygen vacancies in the region of the first barrier layer 215.

Referring to FIG. 7, an internal electric field $F_{int}'$ may be formed in the resistive memory layer 220 by the negative fixed charges 250n inside the first barrier layer 215 and the work function difference between the first and second electrode layers 110 and 130 in the nonvolatile memory device 3 having the structure of FIG. 6. At this time, the negative fixed charges 250n may generate positive fixed charges 250p in a region of resistance memory layer 220 adjacent to interface S1'. The positive fixed charges 250p may increase the internal electric field generated by the work function difference. That is, comparing FIG. 7 with FIG. 4B, a relatively higher internal electric field $F_{int}'$ may be generated in the nonvolatile memory device 3 having the negative fixed charges 250n disposed in the region of the first barrier layer 215 contacting the first electrode layer 210 that is already under the influence of a relatively high work function difference. Accordingly, the nonvolatile characteristics of the memory device as reflected in the shift of hysteresis curve can be realized more effectively as described above and with reference to FIG. 5.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a first electrode layer, a first barrier layer, a resistive memory layer, a second barrier layer and a second electrode layer that are sequentially disposed,
wherein the resistive memory layer comprises a Mott material implementing a Mott metal-insulator transition, and
wherein the Mott material is configured to nonvolatilely store resistivity, that varies depending on an externally applied electric field, through the Mott metal-insulator transition.

2. The nonvolatile memory device of claim 1, wherein the first and second electrode layers have different work functions relative to each other.

3. The nonvolatile memory device of claim 2, wherein the resistive memory layer has an internal electric field that results from a work function difference between the first and second electrode layers.

4. The nonvolatile memory device of claim 2, wherein the first barrier layer comprises a trap site having negative fixed charges disposed in a region of the first barrier layer adjacent to an interface between the first barrier layer and the resistive memory layer, when the work function of the first electrode layer is greater than the work function of the second electrode layer.

5. The nonvolatile memory device of claim 4, wherein the trap site comprises oxygen vacancies.

6. The nonvolatile memory device of claim 1, wherein the resistive memory layer has an electric field-current hysteresis operation characteristic with a first threshold electric field of a positive polarity and a second threshold electric field of a negative polarity.

7. The nonvolatile memory device of claim 6, wherein a resistance state of the resistive memory layer is switchable from an insulative state to a conductive state when an external electric field equal to or higher than the first threshold electric field is applied, and wherein the resistive memory layer stores the switched conductive state when the external electric field is removed.

8. The nonvolatile memory device of claim 6, wherein a resistance state of the resistive memory layer is switchable from a conductive state to an insulative state when an external electric field of negative polarity, which is equal to or greater than the second threshold electric field, is applied, and
wherein the resistive memory layer stores the switched insulative state when the external electric field is removed.

9. The nonvolatile memory device of claim 1, wherein the Mott material comprises at least one of vanadium oxide (VO2 or V2O3), chromium oxide (CrO2), nickel oxide (NiO), copper oxide (CuO), and niobium oxide (NbO2).

10. The nonvolatile memory device of claim 1, wherein the Mott material has a stoichiometric metal-oxygen bond in an insulative state and has a non-stoichiometric metal-oxygen bond having an oxygen vacancy or a metal vacancy in a conductive state.

11. The nonvolatile memory device of claim 1, wherein the resistive memory layer has a thickness of one nanometer (1 nm) to ten nanometers (10 nm).

12. The nonvolatile memory device of claim 1, wherein one of the first and second electrode layers comprises ruthenium (Ru), and the other of the first and second electrode layers comprises tungsten (W) or titanium nitride (TiN).

13. The nonvolatile memory device of claim 1, wherein one of the first and second electrode layers comprises lightly doped silicon (Si), and the other of the first and second electrode layers comprises relatively heavily doped silicon (Si).

14. The nonvolatile memory device of claim 1, wherein each of the first and second barrier layers comprise at least one of silicon oxide, silicon nitride, aluminum oxide, and silicon oxynitride.

15. The nonvolatile memory device of claim 14, wherein each of the first and second barrier layers has a thickness of a half nanometer (0.5 nm) to two nanometers (2 nm).

16. A nonvolatile memory device comprising:
a first electrode layer, a first barrier layer, a resistive memory layer including a Mott material implementing a Mott metal-insulator transition, a second barrier layer and a second electrode layer that are sequentially disposed,
wherein the first and second electrode layer have different work functions, and
wherein the Mott material is configured to nonvolatilely store a pair of different resistivities.

17. The nonvolatile memory device of claim 16, wherein the Mott material comprises at least one of vanadium oxide (VO2 or V2O3), chromium oxide (CrO2), nickel oxide (NiO), copper oxide (CuO), and niobium oxide (NbO2).

18. The nonvolatile memory device of claim 16, wherein the Mott material has a stoichiometric metal-oxygen bond in an insulative state and has a non-stoichiometric metal-oxygen bond having an oxygen vacancy or a metal vacancy in a conductive state.

19. The nonvolatile memory device of claim 16, wherein the first barrier layer comprises a trap site having negative fixed charges disposed in a region of the first barrier layer adjacent to an interface between the first barrier layer and the resistive memory layer, when the work function of the first electrode layer is greater than the work function of the second electrode layer.

20. The nonvolatile memory device of claim 19, wherein the trap site comprises oxygen vacancies.

* * * * *